United States Patent [19]

Fazlin

[11] 4,425,210

[45] Jan. 10, 1984

[54] PLASMA DESMEARING APPARATUS AND METHOD

[76] Inventor: Fazal A. Fazlin, 11400 4th St. N. #101, St. Petersburg, Fla. 33702

[21] Appl. No.: 253,007

[22] Filed: Apr. 10, 1981

Related U.S. Application Data

[63] Continuation-in-part of Ser. No. 204,329, Nov. 4, 1980, Pat. No. 4,328,081, which is a continuation of Ser. No. 124,468, Feb. 25, 1980, abandoned.

[51] Int. Cl.³ ............................................... C23F 1/00
[52] U.S. Cl. ................................. 204/19 ZE; 204/298
[58] Field of Search ............................ 204/19 ZE, 298

[56] References Cited

U.S. PATENT DOCUMENTS

| | | | |
|---|---|---|---|
| 4,012,307 | 3/1977 | Phillips | 204/19 ZE |
| 4,123,663 | 10/1978 | Horike | 204/19 ZE |
| 4,148,705 | 4/1979 | Battey et al. | 204/19 ZE |
| 4,230,553 | 10/1980 | Bartlett et al. | 204/19 ZE |
| 4,264,393 | 4/1981 | Gorin et al. | 204/19 ZE |
| 4,277,321 | 7/1981 | Bartlett et al. | 204/19 ZE |
| 4,282,077 | 8/1981 | Reavill | 204/298 |
| 4,285,800 | 8/1981 | Welty | 204/19 ZE |
| 4,287,851 | 9/1981 | Dozier | 204/19 ZE |
| 4,289,598 | 9/1981 | Engle | 204/19 ZE |
| 4,307,283 | 12/1981 | Zajac | 204/19 ZE |

Primary Examiner—Veronica O'Keefe
Attorney, Agent, or Firm—Stefan Stein

[57] ABSTRACT

This invention is based on desmearing holes of multi-layered printed wiring boards by flowing plasma through the holes. Desmearing of plasma etching applies active gases to organic surfaces causing a cleaning reaction and removal of the smear.

13 Claims, 20 Drawing Figures

PLASMA DESMEARING APPARATUS AND METHOD

CROSS REFERENCE TO RELATED APPLICATION

This application is a continuation-in-part application of earlier filed application Ser. No. 204,329, filed Nov. 4, 1980 now U.S. Pat. No. 4,328,081, which is a continuation of earlier filed application Ser. No. 124,468, filed Feb. 25, 1980 now abandoned.

BACKGROUND OF THE INVENTION

1. Field of the Invention

This invention relates to apparati and methods for desmearing the holes of multi-layered printed wiring boards by flowing a plasma gas therethrough. More particularly, this invention relates to apparati and methods for compensating for the saturation of the plasma gas as it becomes saturated during the desmearing of the printed circuit boards.

2. Description of the Prior Art

Plasma etching or desmearing is a technique utilizing active gases which are applied to organic surfaces such as epoxy, and more specifically in the hole of a printed wiring board, resulting in a chemical reaction which cleans the hole of unwanted smear. The reactant products are volatile, usually inert, and are pumped away through the vacuum system. A better appreciation of plasma technology as applied to state of the art printed wiring boards will be better understood with an explanation of smear, and the wet processes used to remove such smear.

Smear in a plated-through hole in a multi-layer wiring board is defined as the presence of an insulative or foreign material or combination of both over the conductive inner circuit, which, if not removed, causes poor electrical interconnect after the electrodeposition of copper in the hole of a multi-layer printed wiring board (hereinafter MPWB).

Smear is a natural result of printed wiring board drilling operations. A few possible causes of drill smear include improper lamination cycle (causing resin curing problems) resulting in "soft spots" on the board, substandard resin characteristics, substandard drills in the form of dullness, incorrect geometry, speed, feed, incorrect back-up material, and board hole design. Technological advances in drilling and lamination have reduced the quantity of smear, but it is still virtually impossible to produce smear-free holes economically in production quantities.

The most commonly used procedure to remove smear by MPWB manufacturers is called the etchback process. This process begins with using either sulfuric acid or chromic acid and hydrofluoric acid or ammonium bifluoride/hydrochloric acid. At times, various combinations are used. After the acid treatment, the panels are rinsed in distilled or city water, neutralizing solution, and a final rinse. Thereafter they are either blown dry or heat dried. Modifications of these procedures for cleaning the holes depend on each manufacturer's requirements, but they are essentially a wet process.

Concentrated acids and their byproducts (corrosive fumes) are very undesirable since they pose serious health hazards and unsafe work environments. It is important to observe that the etchback process, while removing smear, can create its own set of problems. For example, after etchback, if the MPWBs are not properly rinsed and neutralized, they can leave salt deposits which can be transferred into the plating baths, this contaminating the solutions, or the salts can be trapped inside, between the hole wall and the copper barrel, thus migrating laterally to yield poor insulation resistance and/or high resistance shorts. These shorts may not be detected visually and electrically at final inspection but can degrade the MPWBs in the field. This reduces product life and reliability. To resolve this condition, all MPWBs have to be thoroughly rinsed. If possible, rinsing should take place under pressure or agitation or a combination of both. The large amount of rinse water employed must be adequately treated prior to disposing of it as waste. The etchback process also leaves the hole wall ragged, and secondary treatment is required to condition the hole wall prior to the electrolytic deposition of copper or other materials.

The most significant drawback in the wet process is the lack of control. This is due to the fact that the rate of etchback is a function of solution concentrations, temperature, time and other factors. When there is no steady-state system available to maintain the proper chemical concentrations, it becomes a time-based function. The time-based function, in turn, is almost impractical to calculate from one lot to the next. As a result the wet process becomes a guessing game, and an art rather than a science.

More recently it has been demonstrated that the use of plasma technology can be applied to removing smear instead of wet-acid process. "Plasma" is defined as matter in an "elevated state". Physical properties of matter in the plasma state are somewhat similar to those in the gaseous state. The flow patterns and characteristics become extremely agressive in the plasma state, where the gases are essentially in a nascent form. Plasma or these "active species" are created in a region between a pair of RF (radio frequency) electrodes, and are then directed toward the target surface. In this instance the example is directed to the holes in the MPWBs.

For desmearing with plasma of the MPWBs, various gases can be used depending upon the individual manufacturer's requirements and the type of laminate material. The gases more generally used are oxygen ($O_2$) and a carbontetrafluoride ($CF_4$). When a mixture of these gases passes through the RF electrodes in a vacuum, the active species formed are said to be nascent oxygen and atomic fluorine. These active species react with the polymer glass combination in the holes of the MPWB to form volatile products which are subsequently removed by exhausting.

The desmearing process using plasma gas basically requires a chamber, a vacuum pump, a source of RF energy, and metered gases. The chamber must withstand the vacuum, but more importantly, it must accommodate MPWBs so that the proper directional flow of the active species is possible, and so that there is an even flow of these species throughout the matrix of boards to achieve uniform results. This may be accomplished by placing the boards closest to the gas source and exhaust port a certain distance away. This distance is termed as a transition area. Once the chamber is designed, the vacuum pump must be selected with the proper throughput capability and compatibility with the gases used. The requirements for the source of RF energy depend upon the electrode surface area and power density requirements (Watts per square inch, not just Watts).

Several manufacturers are offering plasma desmearing systems which include a cylindrical chamber with a front loading door and either a barrel or planar electrode configuration. The MPWBs are processed either vertically or horizontally. The gas inlet is located on the top barrel wall, usually toward the front of the chamber. The exhaust valves are usually near the back wall. With this configruation, plasma is generated within the body (which acts as ground) and the electrodes. With a barrel electrode, the intensity of the field varies as it approaches the center of the chamber. Planar electrodes provide better distribution of the field, so long as they are paired (power and ground,) since the gases within the plasma state reduce to ash the undesirable substrate material.

The flow characteristics of the gases are a function of the gas inlet at a relatively higher pressure to the exhaust outlet at a low pressure. Experiments have shown that the plasma gas becomes saturated as the plasma gas flows from the gas inlet to the exhaust outlet during the desmearing process. Accordingly, the MPWBs located near the gas inlet tend to be desmeared more than those MPWBs located near the exhaust outlet. Moreover, the flow of the plasma gas tends to concentrate about the peripheral edge portions of the MPWBs such that the holes located near the outer portions of the MPWBs are desmeared more than those holes located in the central portion of the MPWBs. In each instance, it is almost impossible to achieve the uniform results in the desmearing of MPWBs of each lot.

Accordingly, it is an object of this invention to provide an apparatus which overcomes the aforementioned inadequacies of the prior art devices and provides an improvement which is a significant improvement in the desmear/etchback art.

Another object of this invention is to provide an apparatus and method for desmearing which is of significant importance to desmearing the drilled holes in MPWBs.

Another object of this invention is to provide an apparatus and method for plasma desmearing of MPWBs in a controlled process with a high level of precise repeatability and at cyclic rates substantially reducing the overall cost of desmearing.

Another object of this invention is to provide an apparatus and method for spacing MPWBs within a chamber for desmearing which results in a uniform treatment of the holes within the MPWBs irrespective of whether the MPWBs are located central of the unit or at the ends thereof.

Another object of this invention is to provide an apparatus and method for mixing or blending various gases for desmearing thereby readily accommodating various types of MPWBs for desmearing.

Another object of this invention is to provide an apparatus and method for increasing the intensity of the electric fields produced by succeeding electrode pairs to compensate for the saturation of the plasma as the plasma flows from one end of the chamber to the other.

Another object of this invention is to provide an apparatus and method for varying the intensity of the electric field produced by each pair of electrodes whereby the electric field decreases from the central area of the electrode pair to the outer peripheral portions thereof thereby assuring that all of the holes located in the MPWBs are uniformly desmeared during the desmearing process.

The foregoing has outlined some of the more pertinent objects of the invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description describing the preferred embodiment in addition to the scope of the invention defined by the claims taken in conjunction with the accompanying drawings.

SUMMARY OF THE INVENTION

The present invention is directed to employing a rectilinear chamber for desmearing in which the two transitional ends are frustopyramidal in configuration. Each frustropyramidal diffusion chamber has a controlled exhaust valve which is piped to the vacuum pump. Gas can be introduced to the diffusion chamber at a point adjacent the exhaust valve and centrally therefrom. Ideally there are an odd number of electrode pairs spaced vertically which generate a primary field, and further spaced apart pairs generating a secondary field therebetween. Because the chamber is retilinear, it can be proportioned to accommodate vertically spaced MPWBs in the secondary chamber portions.

The method contemplates flowing plasma through a rectangular chamber by positioning the pairs of electrodes in a close spaced relationship to provide a primary field, the power electrode of each electrode pair secured to a radio frequency source and the ground electrode of each electrode secured to ground, and then spacing the electrode pairs a sufficient distance to permit the insertion of objects to be desmeared in the secondary field. The flow of plasma is directed to impact the objects and can be from left to right, then right to left, thereby reversing the flow, pulsating or steady. In addition, in certain applications where plasma flow from one end to the other is not desired, the gas can be introduced centrally. The central introduction is also desirably employed for purging the rectilinear chamber.

In an improved embodiment, different amounts of electrical energy at a radio frequency are supplied by two or more generator means to the power electrode of the electrode pairs such that the intensity of the electric fields produced by succeeding electrode pairs can be progressively increased along the flow path of the plasma gas. This compensates for any saturation of the plasma gas as the plasma gas flows from one end of the chamber to the other. When the direction of the flow of plasma is reversed, the amount of electrical energy supplied to the electrode pairs can also be reversed such that the intensity of the electrical fields still progressively increases along the reverse flow path of the plasma gas thereby compensating for the saturation of the plasma gas when flowing in the reverse direction.

It is noted that in actual practice, the holes located in the outer peripheral edge portions of the MPWBs tend to be desmeared more than those holes located within the center portion of the MPWBs. In order to provide uniform desmearing within each individual MPWBs, the improved apparatus and method includes varying the electric field produced by the power electrode of one or more of the electrode pairs such that the intensity of the electric field thus produced decreases from the central portion of the power electrode to the outer peripheral edges thereof. More particularly, in one embodiment, a separate electrode is positioned within the center portion of the power electrode and is insulated therefrom by means of ceramic insulators or the like. A separate source of electrical energy is then connected to the central electrode such that the intensity of the electric field created by the central electrode can be varied separately and apart from the intensity of the electric field produced by the outer power electrode. Additional separate electric fields may be similarly produced by incorporating another power electrode between the outer power electrode and the central power electrode, and then connecting a third source of electrical energy thereto. Accordingly, it should be appreciated that the intensity of the electric fields may be selectively controlled to regulate the amount by which the holes in the individual MPWBs are desmeared.

In another embodiment, the intensity of the electric field produced by each electrode pair may be varied by securing a dielectric to the sides of the power electrode. The thickness of the dielectric is preferably progressively increased from the central portion to the outer peripheral edges of the power electrode such that the intensity of the electric field produced by the power electrode progressively decreases from the central portion to the outer edge portion of the power electrode. In other words, the dielectric serves as an attenuator which progressively reduces the radiation of the electrical energy emitted from the surface of the power electrode from the central portion to the outer edge portions of the electrode.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should be realized by those skilled in the art that such equivalent constructions do not depart from the spirit and scope of the invention as set forth in the appended claims.

BRIEF DESCRIPTION OF THE DRAWINGS

Further objects and advantages of the present invention will become apparent as the following description of an illustrative embodiment proceeds, taken in conjunction with the accompanying drawings, in which.

Similar reference characters refer to similar parts throughout the several views of the drawings.

DESCRIPTION OF THE PREFERRED EMBODIMENT

Figure 1:
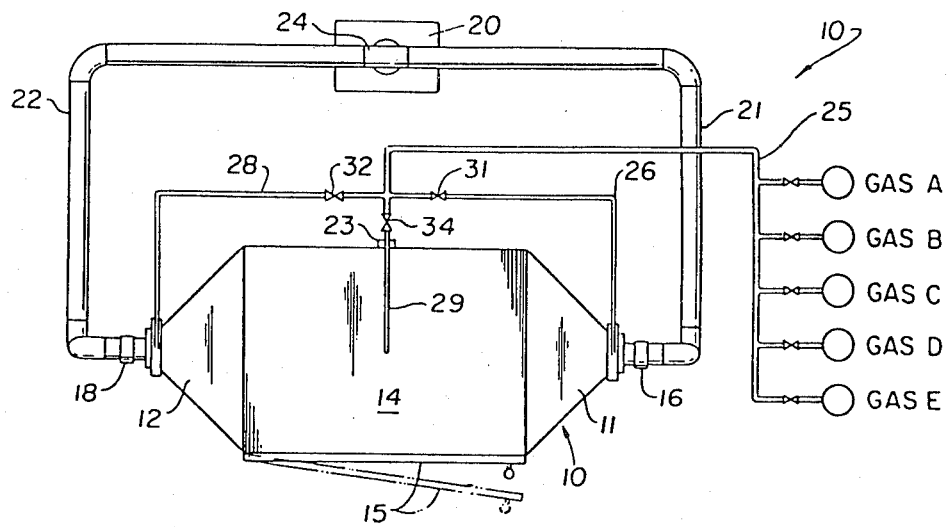
FIG. 1 is a top view of the desmearing system showing the door of a chamber partially open in phantom lines and diagrammatically showing the gas manifold to the right thereof.
Figure 3:
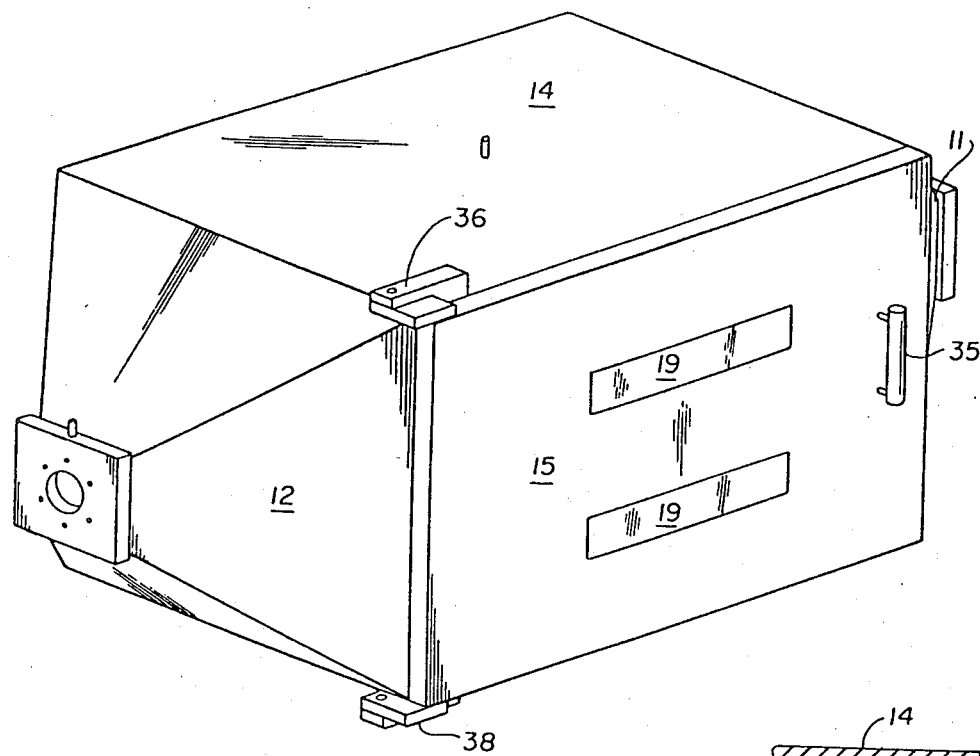
FIG. 3 is an isometric view of the chamber portion of the plasma desmearing apparatus showing the left end frustopyramidal diffusion stage and exhaust plate.

The general system for desmearing is shown in the plan view, partially diagrammatic, of FIG. 1. There it will be seen that the chamber 10 is centrally disposed, having a right frustopyramidal gas diffusion chamber 11 and a left frustopyramidal gas diffusion member 12. "Frustopyramidal" includes any shape tapering from rectangular to an exhaust connection. The cubical portion 14 has a rectangular cross-section, and terminates in the two diffusion pyramids 11 and 12. When the chamber 10 is referred to as "cubical" it is not meant to mean that it is equilateral, but rather rectangular in cross-section whether the section is taken longitudinally or laterally. Ideally, the cross-section is developed to accommodate the particular target, in this instance rectangular MPWBs. The front portion of the cube portion 14 has a door 15 as shown diagrammatically in the partially opened position. A right exhaust valve 16 and left exhaust valve 18 are provided at the ends of the frustopyramidal transition chambers 11 and 12. Typically, a three inch angle valve manufactured by Vacoa is employed which is air activated at 80 psi, solenoid controlled, and can be remotely programmed for either an on or an off condition, there being no throttling with the subject valves 16 and 18. The door 15 is provided with windows 19 (see FIG. 3) for observing the operation of the unit and uniformity of plasma flow as will be discussed hereinafter.

A vacuum pump 20 is connected to the right exhaust pipe 21 and left exhaust pipe 22 by means of the exhaust Tee 24. Ideally suited for this operation is the Stokes Pennwalt vacuum pump model 212 MBX with halocarbon oil for oxygen service. Such a pump exhausts to approximately 3 microns, and has a 275 cubic foot per minute capacity. An air valve 23 is provided in the rear center of the cube portion 14 to normalize the chamber 10 at the end of the cycle. The air valve 23 has a $\frac{5}{8}''$ bore and is solenoid activated.

As noted further in FIG. 1, a gas manifold 25 connects a plurality of gas bottles identified as gases A–E inclusive and a right gas inlet 26 and left gas inlet 28 connect to the ends of the transition chambers 11 and 12 inboard of the exhaust valves 16 and 18. In addition, a center gas inlet 29 is provided, shown here connected to the upper central portion of the chamber 10. A single gas line 30 connects the manifold 25 to the left, right and center inlets. Each of the right, left and center inlets has their respective control valves 31, 32, and 34. The control valves for each of the inlets are on/off type valves. The gases are blended at the manifold 25 by means of manually adjusted flow regulators at each of the gases A–E, with a solenoid valve turning the gas on or off. As will be described hereinafter the gases ideally are oxygen, freon 14 (carbontetrafluoride); hydrogen fluoride in the dry gaseous state; nitrogen; and argon containing a portion of water vapor to serve to activate the hydrofluoric acid under cerain conditions.

Figure 2:
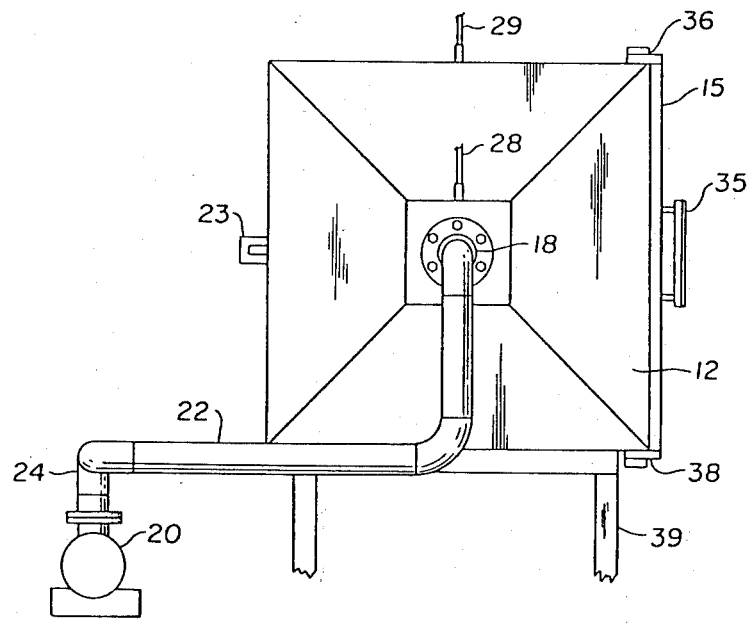
FIG. 2 is a left end view of the plasma desmearing apparatus as shown in FIG. 1, with the underneath stand broken away.

As noted in FIG. 2, the door 15 is provided with a handle 35, the door being secured to the cube portion 14 by means of an upper hinge 36 and a lower hinge 38. The entire unit is supported on a stand 39, shown partially broken in FIG. 2.

Figure 5:
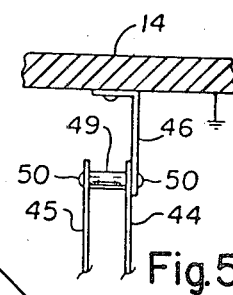
FIG. 5 is an enlarged view of the upper end of one of the pairs of electrodes showing how the power electrode and the ground electrode are spaced apart from one another and secured to the interior portion of the chamber.
Figure 4:
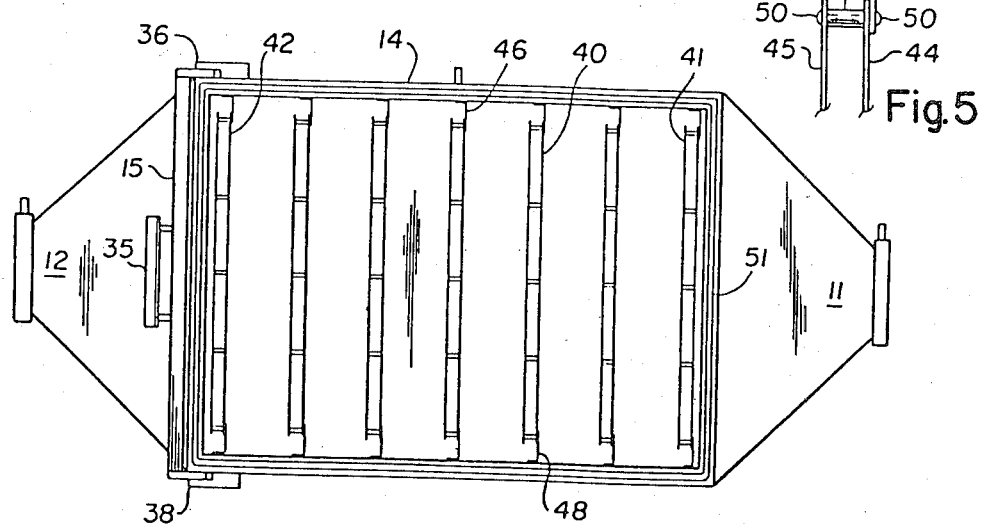
FIG. 4 is a front view of the plasma desmearing chamber showing the door open, and revealing the location of the pairs of electrodes interiorly of the chamber.

Turning now to FIG. 4, it will be seen that the electrodes 40 are in pairs. The pairs of electrodes 40 are normally inserted within the cubical 14 in an odd number, there being a right electrode end 41 and a left electrode end 42. More specifically, the electrodes, as shown in FIG. 5, are approximately 24 by 24 inches formed from 5/32 inch thick aluminum, 58% open. The porosity is developed by staggered five-sixteenths inch holes. The ground electrode plate 44 is grounded, and the power electrode plate 45 is spaced therefrom. Ground brackets 46, 48 secure the grounded plates 44 to the upper and lower portion of the cube portion 14. An insulated spacer 49 is provided between the two electrodes 44, 45 and the electrodes are then secured in spaced relationship as determined by the size of the insulated spacer 49 by means of the plate connectors 50. It is important that the door 15 is suitably sealed by means of the framing seal 51 as shown in FIG. 4. Normally, this seal is coated with a silicone or other sealing compound.

Figure 7:
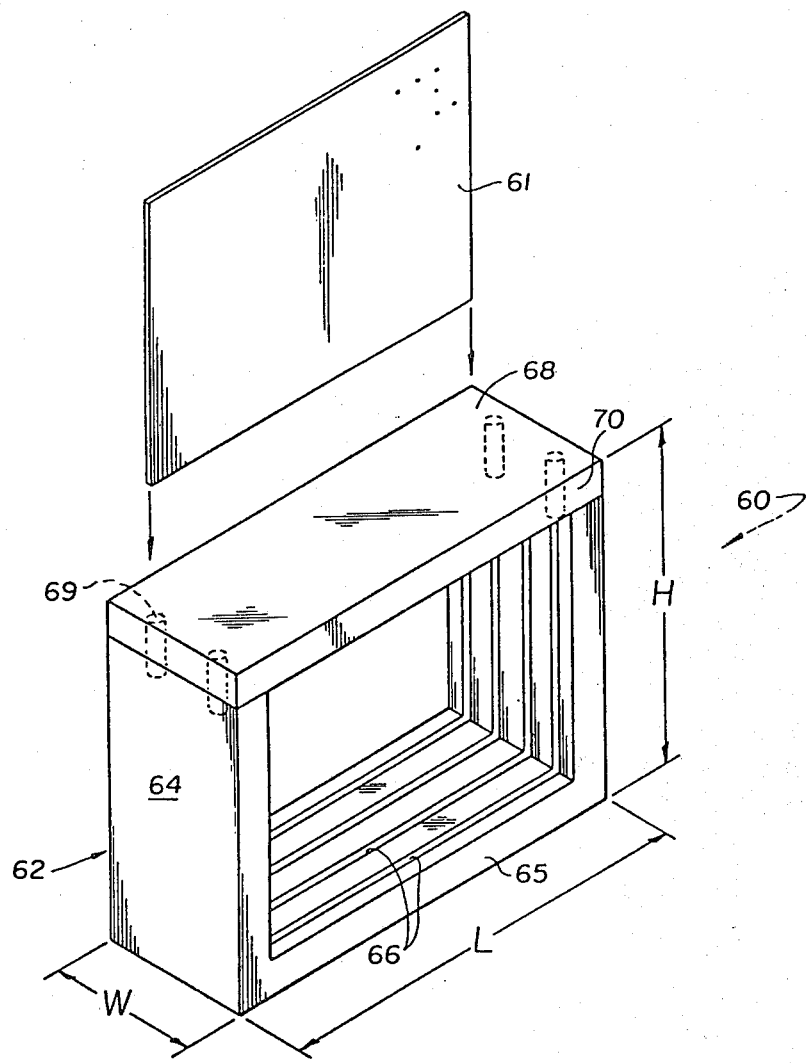
FIG. 7 is a perspective partially diagrammatic view of a typical MPWB and a frame for securing the MPWBs within the chamber.

Turning now to FIG. 7, it will be seen that a typical MPWB frame 60 is provided for use in the chamber 10 proportioned to fit within the secondary field. The frame 60 comprises a U-shaped lower element made up of opened ends 64, and a bottom 65. The ends 64 and bottom 65 are provided with slots 66. In addition, a top 68 (also provided in its underneath portion with slots 66) is secured by means of mounting pins 69 to the two ends 64. When the top 68 is raised, four MPWBs 61 are inserted in the slots 66, and then the top 68 is again secured on the MPWB 61. Desirably the length and height (L and H) of the frame 60 is proportioned to engage the bottom, sides, and top of the cube portion 14. The width W of the frame 60 is slightly less than the distance between adjacent pairs of electrodes 40. The exterior skirt 70 (formed on the end 64, bottom 65, and top 68) are of a sufficient dimension to mask the periphery of the MPWB 61 so that the plasma flow will not leak around the frame 60, but rather be directed through the holes in the MPWB 61.

The RF source, not shown, employs a generator manufactured by E.N.I. Power Systems of Rochester, NY. The unit is designated as Model EGR4800. This generates RF Power to a maximum of 4,800 Watts. In normal usage 4,200 to 4,400 Watts are employed. A 50 ohm cable is provided between the generator and the power electrode 45. The frequency is between 8 kilohertz and 111 kilohertz, at the low side of the AM band. It is important that the entire system be grounded, essentially as shown in FIG. 5. This completes the RF application of power and of course developing a primary field between the spaced pairs of electrodes 41 and 42, and a secondary field at the larger spaces inbetween the adjacent electrode pairs. It is within the secondary field that the target to be desmeared is positioned.

Figure 8:
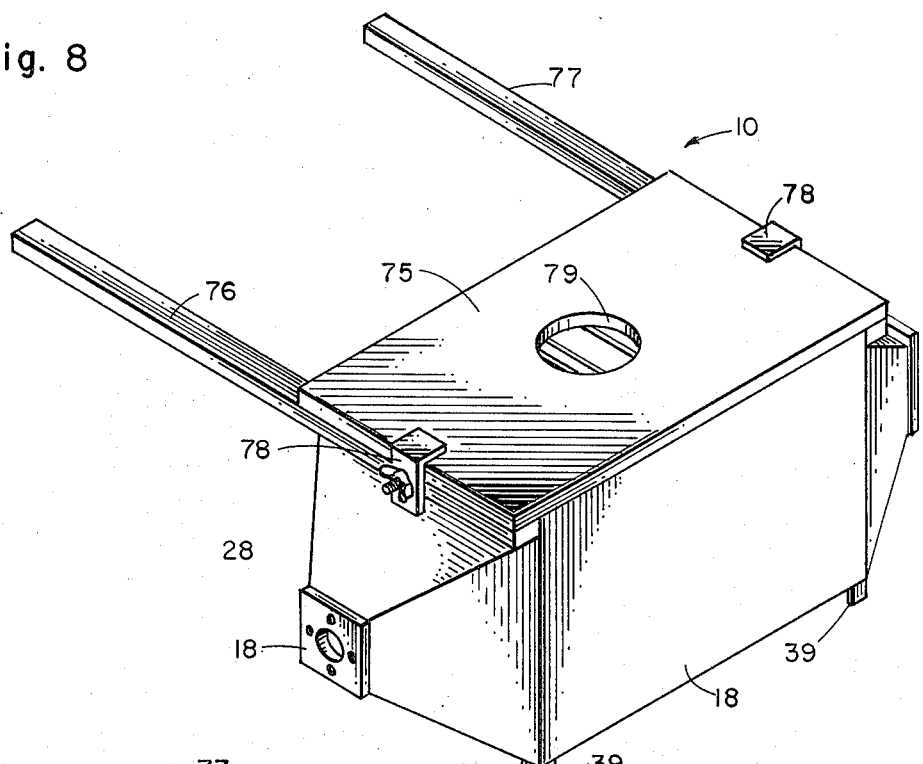
FIG. 8 is an isometric view of an improved embodiment of the chamber portion of the plasma desmearing apparatus wherein the chamber is top loading to facilitate the loading and unloading of a plurality of MPWBs thereby.
Figure 9:
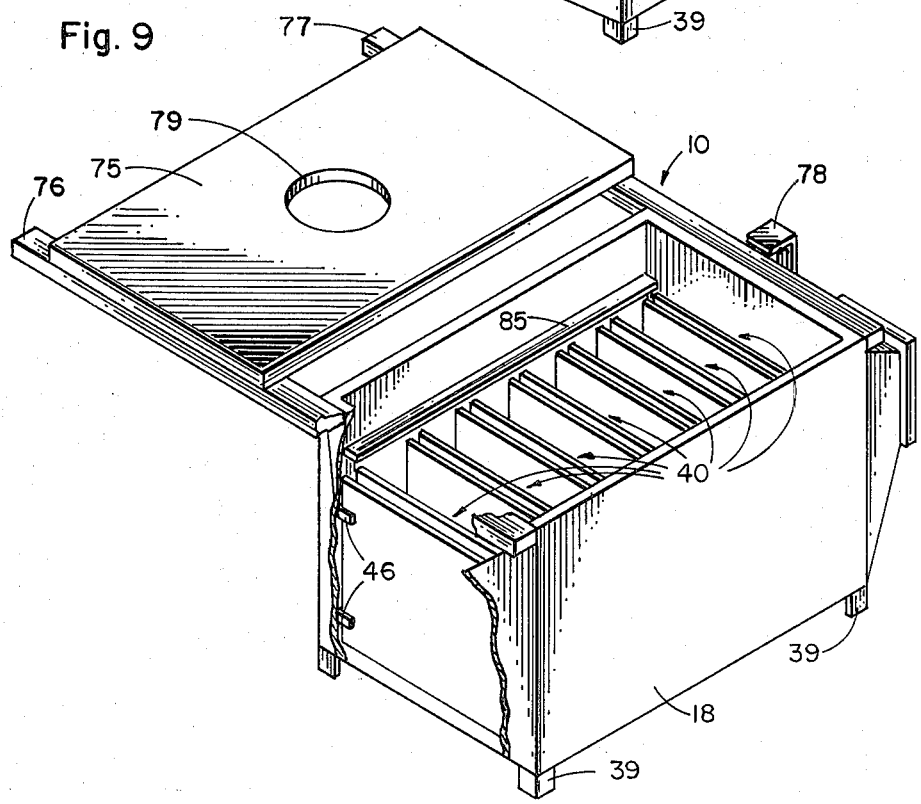
FIG. 9 is a partial cutaway view of FIG. 8 with the door of the chamber in an open position illustrating the position of the electrode pairs within the chamber itself.

FIG. 8 is an isometric view of an improved embodiment of the chamber 10. More particularly, chamber 10 comprises a substantially rectangular configuration having the frustalpyramidal gas diffusion chambers 10 and 11 connected to the sides thereof and a removable lid 75 secured to the opened end thereof. The lid 75 is preferably slideably connected to a pair of rails 76 and 77 connected to the sides of the chamber 10. Suitable latches 78 are provided for tightly securing the lid 75 over the opened end of the chamber 10. A viewing port 79 is disposed within the lid 75 for viewing the operation of the unit and the uniformity of the plasma flow therethrough. To open the chamber 10, lid 75 is slid rearwardly along rails 76 and 77 to the open position as shown in FIG. 9. It should be appreciated that the chamber 10 is now fully opened for receiving the plurality of MPWBs to be desmeared.

FIG. 9 is a partial cutaway isometric view of the chamber 10 illustrating the placement of the electrode pairs 40 therein. Specifically, the electrode pairs 40 are positioned within the chamber 10 in a manner substantially identical to that which was previously described and shown in FIG. 4 enabling the MPWBs to be positioned within the secondary electrical field created between adjacent electrode pairs 40.

Figure 10:
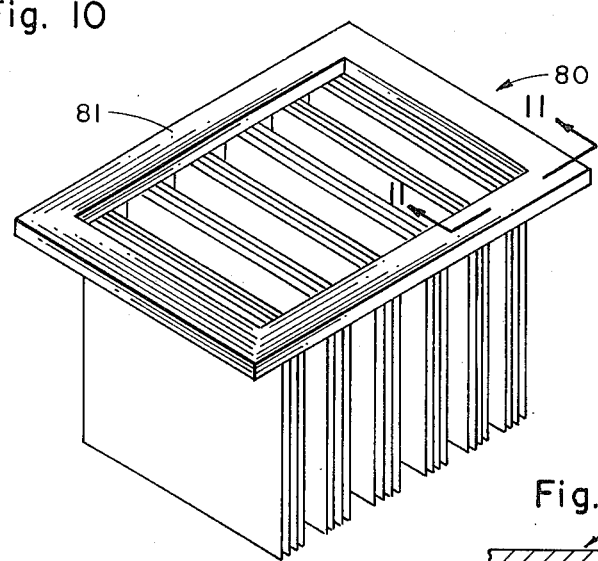
FIG. 10 is an isometric view of an MPWB rack having a plurality of MPWBs installed therein for insertion within the chamber of the plasma desmearing apparatus.
Figure 11:
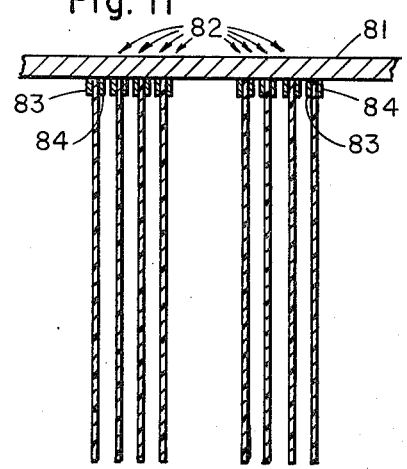
FIG. 11 is a cross-sectional view of FIG. 10 along lines 11—11 illustrating the manner in which the MPWBs are secured to the MPWB rack.

FIGS. 10 and 11 are isometric and cross-sectional views, respectively, of a unique MPWB rack which enables a plurality of MPWBs to be quickly and easily loaded within the chamber 10 and then subsequently unloaded. The MPWB rack 80 comprises a substantially planar frame member 81 having a number of groups of retainer clips 82 secured to the underside thereof. The groups of retainer clips 82 are spaced apart from one another a distance substantially equal to the thickness of each electrode pair 40. The individual retainer clips 82 comprise a left and right member 83 and 84 which are resiliently biased toward one another. During operation, individual MPWBs are secured to the underside of the frame member 81 by pushing the edge of the MPWBs between the members 83 and 84 of the retainer clips 82. After each of the retainer clips 82 filled with a respective MPWB, the MPWB rack 80 is lifted by hand or by a hoist, positioned over the opened end of the chamber 10, and then lowered into the chamber 10 such that the groups of the retainer clips 82 and correspondingly, the groups of MPWBs, the positioned between adjacent electrode pairs 40. A flange member 85 is connected to each of the sides of the chamber 10 to enable the frame member 81 of the rack 80 to seat thereon, rather than on the top of the electrode pairs 40. The lid 75 is then slid forwardly and secured over the opened end of the chamber 10 by means of latches 78.

Figure 12:
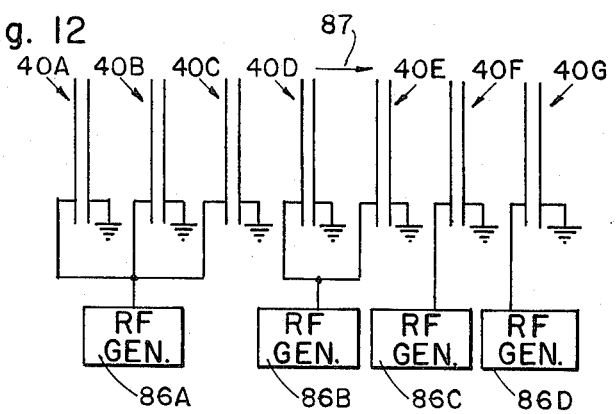
FIG. 12 is a diagrammatic view illustrating a plurality of RF generators, each of which is connected to one or more of the electrode pairs.

FIG. 12 is a diametric view illustrating one particular manner for connecting two or more RF generators 86 to one or more of the electrode pairs 40. More particularly, FIG. 12 illustrates four RF generators 86A–B which are respectively connected as shown to the seven electrode pairs 40A–G. The preferable direction of the flow of the plasma gas with respect to the electrodes 40A–G is illustrated by arrow 87. More particularly, RF generator 86A is connected to the power electrode 45 of the first three electrode pairs 40A, 40B, and 40C. The second RF generator 86B is similarly connected to the power electrode 45 of the two succeeding electrode pairs 40D and 40E. Finally, the remaining two RF generators 86C and 86D are respectively connected to the power electrode 45 of the two remaining electrode pairs 40F and 40G. Each of the RF generators 86A–D can be individually regulated to supply the same or differing amounts of electrical power to their respective electrode pairs 40A–G. In either instance, or a combination of both, the intensity of the primary field and the secondary field created by the electrode pairs 40A–G is serially increased along the flow path of the plasma gas to compensate for the saturation of the plasma gas as the plasma gas flows through the holes in the MPWBs. Accordingly, uniform desmearing of all of the holes can be achieved.

It should be appreciated that the diagrammic representation shown in FIG. 12 is merely illustrative of the many different combinations possible for connecting a plurality of RF generators 86 to one or more of the electrode pairs 40, and should not be construed as limiting the subject invention to the specific diagrammic representation as shown and described. Moreover, it should also be understood that the electrical energy supplied by the RF generators 86 to their respective electrode pairs 40 can be controlled, by a switching means, to track a change in direction of the flow of plasma gas such that the plasma gas always flows through succeeding electrical fields of increasing intensity.

Under actual working conditions, it has been learned that the holes located in the outer portions of the MPWBs tend to be desmeared more than those holes located in the center portion of the MPWBs. It is unclear why this occurs. Nevertheless, this improved invention solves the problem through the use of a specially designed power electrode 45, the different embodiments of which are shown in FIGS. 13–20.

Figure 13:
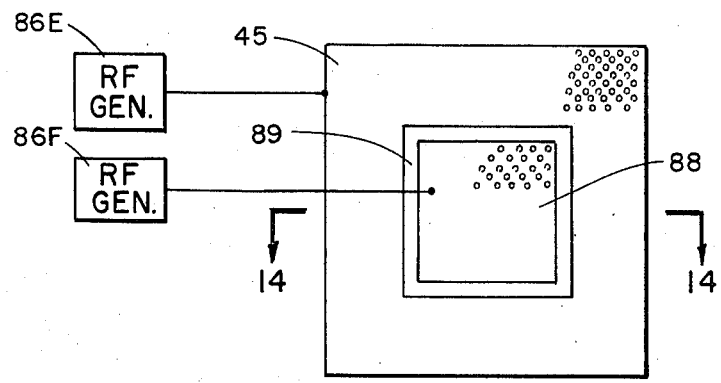
FIG. 13 is a side view of the first embodiment of an improved power electrode of one or more electrode pairs.
Figure 14:
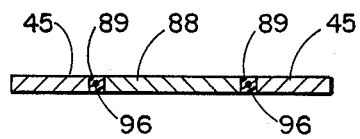
FIG. 14 is a cross-sectional view of FIG. 13 along lines 14—14.
Figure 15:
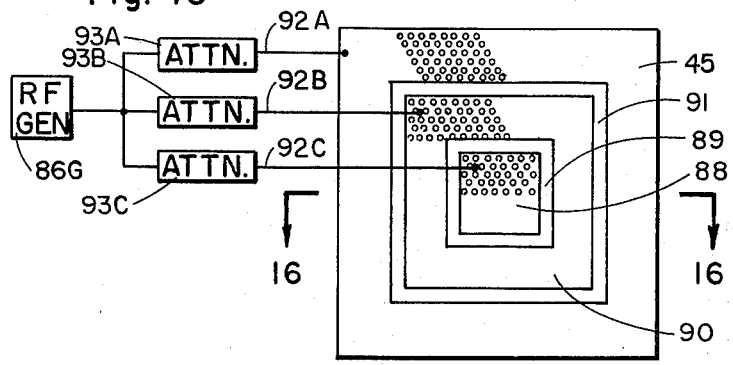
FIG. 15 is a side view of the second embodiment of an improved power electrode of one or more of the electrode pairs.
Figure 16:
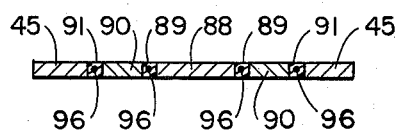
FIG. 16 is a cross-sectional view of FIG. 15 along lines 16—16.

FIGS. 13 and 14 are a side view and a cross-sectional view, respectively, of the first embodiment of the improved power electrode 45. Specifically, a central power electrode 88 is positioned within a drilled out center portion of the outer power electrode 45. A suitable dielectric 89 such as a ceramic insulator is positioned within the airspace between the central power electrode 88 and the outer power electrode 45 to prevent arcing thereacross. FIGS. 15 and 16 are a side view and a cross-sectional view of the second embodiment of the improved power electrode 45 which is a modification of the improved power electrode shown in FIGS. 13 and 14. More particularly, the second embodiment of the improved power electrode 45 comprises a middle power electrode 90 positioned between the central power electrode 88 and the outer power electrode 45. Another dielectric 91 such as a ceramic insulator is positioned between the middle power electrode 90 and the outer power electrode 45 to prevent arcing therebetween. Preferably, the edges of the middle power electrode 90 are separated from the inner edges of the outer power electrode 45 by a distance greater than the distance between the middle power electrodes 90 and the respective ground electrode 44 such that the electrical energy from one RF generator 86 is not fed back to the input of another RF generator 86. Similarly, the edges of the central power electrode 88 are preferably separated from the inner edges of the middle power electrode 90 of the second embodiment or the inner edges of the outer power electrode 45 of the first embodiment by a distance greater than the distance between the central power electrode 88 and the respective ground electrode 44. Alternatively, a grounding wire 96, connected to ground, may be molded within one or both of the dielectric materials 89 or 91 to ground any arcing which may occur between the outer power electrode 45 and the middle power electrode 90 and the central power electrode 88 of the second embodiment or the outer power electrode 45 and the central power electrode 88 of the first embodiment. As shown in FIG. 13, electrical energy at a radio frequency is supplied individually to the power electrodes 45 and 88 by means of a plurality of corresponding RF generators 86E and 86F. Alternatively, or in combination with individual RF generators 86E and 86F, the output of a single RF generator 86G may be connected electrically via power cables 92A, 92B, and 92C to each of the power electrodes 45, 88, and 90, as shown in FIG. 15. A plurality of corresponding attenuation devices 93A, 93B, and 93C are interconnected with the power cable 92A, 92B, and 92C to selectively attenuate the output of the RF generator 86G being supplied to the power electrodes 45, 88, and 90 such that the power electrodes 45, 88, and 90 may create electrical fields of varying intensities.

Figure 17:
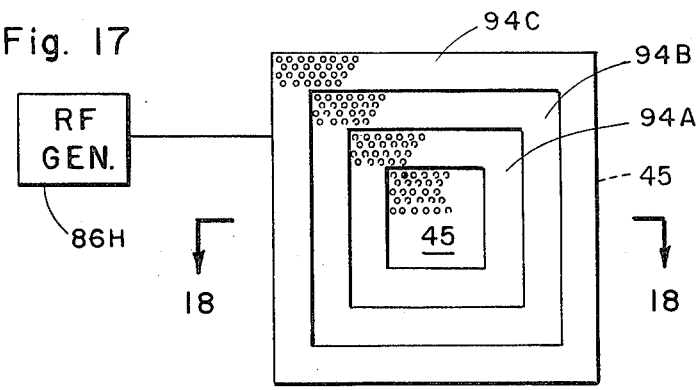
FIG. 17 is a side view of the third embodiment of an improved power electrode of one or more of the electrode pairs.
Figure 18:
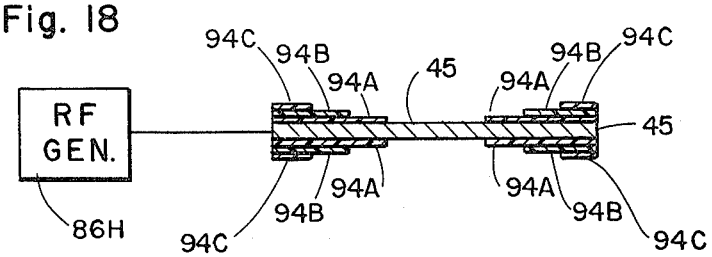
FIG. 18 is a cross-sectional view of FIG. 17 along lines 18—18.

FIGS. 17–20 illustrate a third and fourth embodiment of the improved power electrode 45 wherein only a single RF generator 86H is needed to enable the power electrode 45 to create a primary and secondary electrical field which decreases in intensity from the center area to the outer peripheral area of the power electrode 45. More particularly, as shown in FIGS. 17 and 18, layers 94A, 94B, and 94C of the dielectric material is applied to either or both the primary side and the secondary side of the power electrode 45 such that the overall thickness of the succeeding layers 94 of the dielectric material progressively increases, stepwise, from the central portion of the power electrode 45 to the outer portion thereof. Electrical energy at a radio frequency is supplied from the RF generator 86H to the power electrode 45. Since the surface conductance of the power electrode 45 is progressively decreased by means of the layers 94 of the dielectric material, the intensity of the primary and secondary electrical field created by the power electrode 45 progressively decreases from the center portion to the outer portion of the power electrode 45. The holes located in the individual MPWBs are therefore assured of being uniformly desmeared.

Figure 19:
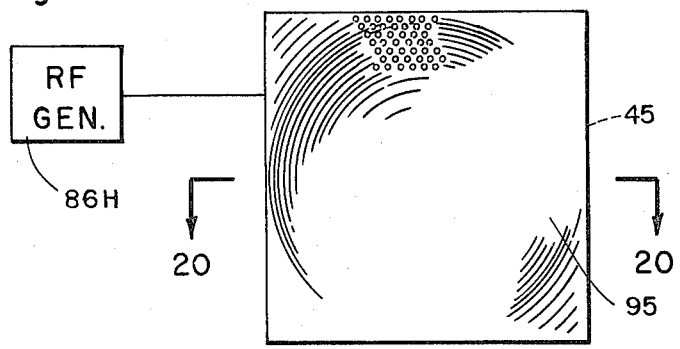
FIG. 19 is a side view of the fourth embodiment of an improved power electrode of one or more of the electrode pairs.
Figure 20:
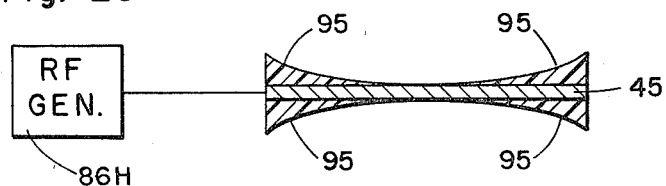
FIG. 20 is a cross-sectional view of FIG. 19 along lines 2.

FIGS. 19 and 20 illustrate a fourth embodiment of the improved power electrode 45 which operates substantially identical to the third embodiment, but with more uniform results. Specifically, an inverted dome-shaped layer 95 of a dielectric material is secured to either or both the primary side or the secondary side of the power electrode 45 such that the thickness of the layer 94 about the outer peripheral portions of the plate electrode 45 is greater than the thickness at the center portion of the plate electrode 45. Accordingly, the inverted dome-shaped layer 95 of the dielectric material functions to progressively attenuate the electric field emitted from the center portion to the outer peripheral portions of the power electrode 45.

THE METHOD

Figure 6:
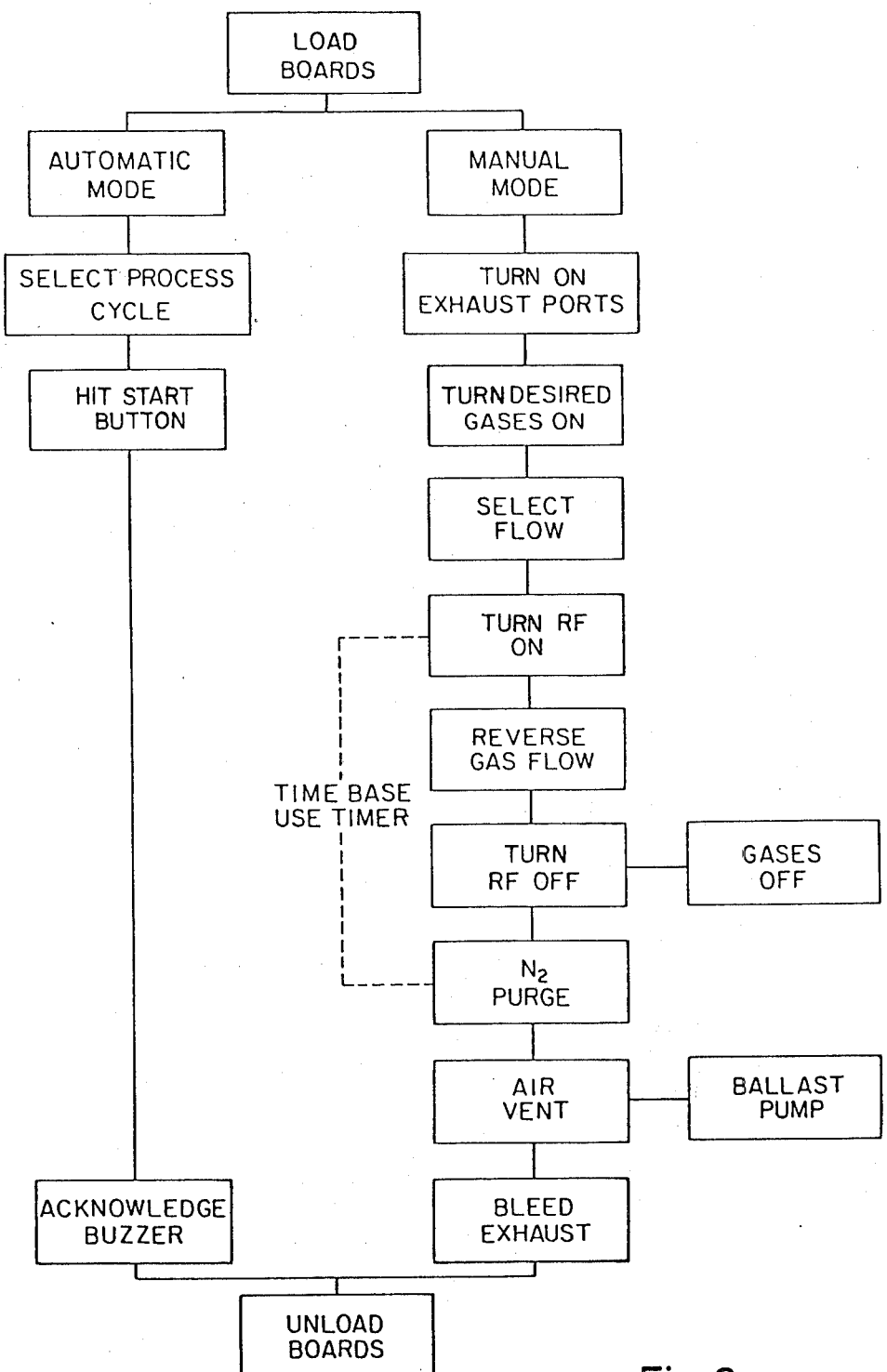
FIG. 6 is a labelled flow-sheet illustrating the steps of the method in sequence.

The method employed is essentially as shown step-by-step from top-to-bottom in FIG. 6. The first step is to load the target or printed circuit boards in the secondary fields between the adjacent pairs of electrodes 45 and 46. With the manual mode, as shown in the right-hand side of FIG. 6, the door is closed and then the exhaust ports are opened. The vacuum pump is activated, and the desired gases are turned on. An ideal blend of gases results when the flow rate is adjusted to provide a mixture of 60% oxygen; 35% freon 14 (carbontetrafluoride $CF_4$); and 5% hydrogen fluoride gas in the dry state (HF). In addition, nitrogen ($N_2$) may be provided for purging. Where an accelerator is desired for the hydrofluoric acid, argon with a mixture of water may be used. After the desired gases are selected, the flow is then determined by activating one or the other of the exhaust valves; and also determining in timed relationship therewith where the gas mixture is to be flowed. A timer then is activated to measure the cycle, and the RF generator is turned on. After a given period of time (as will be set forth in some examples) the gas flow may be reversed by reversing which inlet is employed to admit the gas and which exhaust valve is open to exhaust the same to the vacuum pump. Once the time cycle has been completed, the gases are turned off, and the RF generator is deactivated. A nitrogen purge is employed to clean out the cube portion 14, and then the air valve 23 activated to air vent the chamber 10. Thereafter, the boards are unloaded.

On the automatic computer control cycle, the steps just recited above are programmed, and after the boards are loaded, the process cycle is selected, the start button activated, and the entire cycle proceeds time automatically until an acknowledge buzzer activates, signalling the operator that it is time to unload the boards. The following examples relate to the desmearing of four printed circuit boards in each secondary chamber.

Example 1

Load the unit. Both exhausts are turned on. The gas mixture is selected. The flow of gas from left to right is programmed by shutting off the left exhaust port and activating the left gas inlet valve. The RF frequency is then turned on. After 10 minutes the gas flow is reversed by activating the left exhaust port and right gas inlet, and shutting off the left gas inlet and right exhaust port. Five minutes later all valves are deactivated except both exhaust ports. Thereafter, nitrogen gas is bled in to purge the chamber for 1 minute. Both exhaust ports are then deactivated. The air valve is turned on to pressurize the chamber to atmosphere. Once the chamber is pressurized, the door is opened, and the boards are unloaded. The air valve is then closed.

Example 2

Example two proceeds substantially in accordance with Example 1 above, except the gas inlets are activated to pulsate 2 seconds on, and 13 seconds off. The pulsating gas is more desirable where the holes in the MPWB's are smaller.

Example 3

The MPWB's are loaded, and both exhaust valves activated. The gas mixture is selected to flow the gas right to left by shutting off the right exhaust port and activating the right gas inlet. The RF generator is then turned on. 15 Minutes later the gas flow is reversed as described in Example 1. 10 minutes later the gas flow is reversed again for 10 minutes. The chamber is then purged within two after the RF power is deactivated, and then vented with air to pressurize the chamber to atmosphere.

Example 4

Same as Example 3 except the gas inlets pulsate like in Example 2, 2 seconds on, and 13 seconds off.

Example 5

Same as in any of the Examples 1–4 above, including the introduction of a small percentage of argon carrying water vapor to accelerate the activity of the hydrofluoric acid in desmearing.

Example 6

Same as in any of the Examples 1–5 above, including changing the gas flow direction several times, whether straight flow or pulsating, but not less than 3 times during each process.

The method further contemplates the introduction of gas through the center inlet 29 with both exhaust valves 26, 18 open. When the center line 29 is active only, it will only be for a portion of the cycle since the diffusing characteristics of the frustopyramidal diffusion chambers 11, 12 are not effective when the center line feed alone is operating. On the other hand, the center line feed can be blended in when the gas flow is right to left or left to right, particularly when the flow is reversed, to introduce different flow currents.

The improvements which were described in relation to FIGS. 8–20 of the drawings enable the method as set forth above to obtain more uniform desmearing results during operation of the apparatus. Specifically, the improved method contemplates supplying a first amount of electrical energy at a radio frequency to the power electrode 45 of one or more of the electrode pairs 40 to create a primary and a secondary electrical field at a certain intensity and then supplying a second and greater amount of electrical energy at a radio frequency to the power electrode 45 of one or more succeeding electrode pairs 40. Accordingly, the intensity of the succeeding primary and secondary electrical fields can be controlled to compensate for any saturation of the plasma gas as the plasma gas flows from the gas input to the exhaust. When the flow of the plasma gas is reversed, the amount of electrical energy supplied to the succeeding electrode pairs 40 is similarly reversed such that the plasma gas may always flow through areas of progressively increasing field intensities.

The improvement in the power electrode 45 as described in relation to FIGS. 13-20 assures that all of the holes in the MPWBs will be uniformly desmeared. With respect to FIGS. 13-16, this is accomplished by supplying various amounts of electrical energy at a radio frequency to the outer, middle, and center power electrodes 45, 88, and 90 such that the intensity of the electric field emitted from the electrodes 45, 88, and 90 increases from the center to the outer peripheral edge portions thereof. With respect to the improved power electrode 45 as shown in FIGS. 17-20, the same result is achieved by virtue of the layers of dielectric material 94 and 95 connected to the primary and/or the secondary side of the power electrode 45. In each instance, all of the holes in each MPWB will be uniformly desmeared during operation.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described, what is claimed is:

1. A method for desmearing objects inserted within a chamber, the chamber including pairs of electrodes spaced apart a sufficient distance to permit the insertion of one or more of the objects to be desmeared between adjacent electrode pairs, each electrode pair including a power electrode for receiving electrical energy and a ground electrode connected to ground, comprising the steps of:

evacuating the chamber to a very low pressure;

supplying a first amount of electrical energy at a radio frequency to the power electrode of a first electrode pair to create a primary electrical field between the power electrode and the ground electrode of the first electrode pair and a secondary electrical field between the power electrode of the first electrode pair and the ground electrode of a preceeding electrode pair;

supplying a second and greater amount of electrical energy at a radio frequency to the power electrode of a second and succeeding electrode pair to create a primary electrical field between the power electrode and the ground electrode of the second electrode pair and a secondary electrical field between the power electrode of the second electrode pair and the ground electrode of the first electrode pair; and directing a flow of gas through the first electrode pair and then through the second electrode pair whereby the increased intensity of the electrical field created by the second electrode pair compensates for the saturation of the plasma gas flowing therethrough.

2. A method for desmearing objects inserted within a chamber, the chamber including a power electrode spaced apart a sufficient distance from a ground electrode connected to ground to permit the insertion of one or more of the objects therebetween, comprising the steps of:

evacuating the chamber to a very low pressure;

supplying an amount of electrical energy at a radio frequency to the power electrode to create an electrical field between the power electrode and the ground electrode;

decreasing the intensity of the electrical field thus created from the central area of the power electrode to the outer peripheral area of the power electrode; and directing a flow of gas between the power electrode and the ground electrode.

3. A method for desmearing objects inserted within a chamber, the chamber including pairs of electrode spaced apart a sufficient distance to permit the insertion of one or more of the objects between adjacent electrode pairs, each electrode pair including a power electrode for receiving electrical energy and a ground electrode connected to ground, comprising the steps of:

evacuating the chamber to a very low pressure;

supplying an amount of electrical energy at a radio frequency to the power electrode of each electrode pair to create a primary electrical field between the power electrode and the ground electrode of a first electrode pair and a secondary electrical field between the power electrode of the first electrode pair and the ground electrode of a second and preceeding electrode pair;

decreasing the intensity of the primary electrical field created by the first electrode pair from the central area to the outer peripheral areas of the power electrode of the first electrode pair; and directing a flow of gas through the electrode pairs.

4. An apparatus for desmearing objects with a gas excited within an electrical field, comprising in combination:

a chamber;

lid means connected to said chamber for providing access to the interior of said chamber;

means for connecting the ends of said chamber to a reduced pressure source;

means for introducing a gas into said chamber at a first end of said chamber when said chamber is substantially evacuated by said reduced pressure source;

a first and second porous electrode pairs positioned transfersely within said chamber in a spaced apart relationship to permit the insertion of one or more of the objects to be desmeared therebetween, said first electrode pair being positioned closer to said first end of said chamber than said second electrode pair;

each of said electrode pairs including a ground electrode and a power electrode;

means for connecting each of said ground electrodes to ground;

a first and second generator means providing a first and a second supply of electrical energy at a radio frequency, said second supply being greater than said first supply; and means for connecting said first generator means to said power electrode of said first electrode pair and for connecting said second generator means to said power electrode to said second electrode pair to create primary and secondary electrical fields of two different intensities within said chamber, whereby the gas flows first through said first electrode pair and then through said second electrode pair such that the increased intensity of the electrical fields created by said second electrode pair compensates for the saturation of the gas flowing therethrough.

5. The apparatus as set forth in claim 4, further including a diffusion chamber located at each end of said chamber.

6. The apparatus as set forth in claim 4, further including means for decreasing the intensity of the electrical field created by a first electrode pair from the central area to the outer peripheral edge area of the power electrode of the first electrode pair.

7. The apparatus as set forth in claim 6, wherein said decreasing means comprises a central power electrode disposed within the central area of the power electrode of the first electrode pair and a third generator means connected to said central power electrode.

8. The apparatus as set forth in claim 7, further including a middle power electrode disposed about the central power electrode and a fourth generator means connected to said middle power electrode.

9. The apparatus as set forth in claim 6, wherein said decreasing means comprises layers of a dielectric applied to the surface of the power electrode of the first electrode pair.

10. The apparatus as set forth in claim 6, wherein said decreasing means comprises a layer of a dielectric having an inverted dome-shaped cross-section applied to the surface of the power electrode of the first electrode pair.

11. The apparatus as set forth in claim 4, wherein said chamber has a top opening, with said lid means being operatively connected to a pair of rails enabling said lid means to slide forwardly to a closed position over the opened portion of said chamber.

12. The apparatus as set forth in claim 4, further including a rack enabling the objects to be desmeared to be connected thereto and loaded into said chamber.

13. The apparatus as set forth in claim 12, further including a frame member secured to the inside wall of said chamber to provide a seat for said rack.

* * * * *